(12) United States Patent
Kim

(10) Patent No.: US 6,593,790 B2
(45) Date of Patent: *Jul. 15, 2003

(54) POWER-UP/POWER-DOWN DETECTION CIRCUIT

(75) Inventor: Hong Seok Kim, Kanata (CA)

(73) Assignee: Mosaid Technologies Incorporated, Kanata (CA)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 284 days.

(21) Appl. No.: 09/245,747

(22) Filed: Feb. 8, 1999

(65) Prior Publication Data

US 2002/0005740 A1 Jan. 17, 2002

(30) Foreign Application Priority Data

Feb. 27, 1998 (CA) .............................................. 2230681

(51) Int. Cl.⁷ ................................................. H03K 3/02
(52) U.S. Cl. ........................ 327/198; 327/143; 327/543
(58) Field of Search ................................. 327/142, 143, 327/198, 538, 543, 530, 542, 545, 546, 50–51; 323/315; 365/189.09

(56) References Cited

U.S. PATENT DOCUMENTS 3,925,718 A * 12/1975 Wittlinger .................... 323/315
5,442,312 A *  8/1995 Walter ......................... 327/198
5,838,188 A * 11/1998 Taguchi ....................... 327/530

* cited by examiner

Primary Examiner—Kenneth B. Wells
Assistant Examiner—Minh Nguyen
(74) Attorney, Agent, or Firm—Harold C. Baker; Robert A. Wilkes; Robert G. Hendry

(57) ABSTRACT

A power-up detector for detecting power-up and power supply voltage bump conditions includes a current mirror connected to the power supply. A pair of series connected resistors are connected between the current mirror and ground thereby providing a bias point at a junction of the series connected resistors. A field effect transistor having a source-drain circuit is connected between the current mirror and ground for providing an output signal to an inverter. The field effect transistor being is controlled by the voltage at bias point between the series connected resistors.

2 Claims, 5 Drawing Sheets

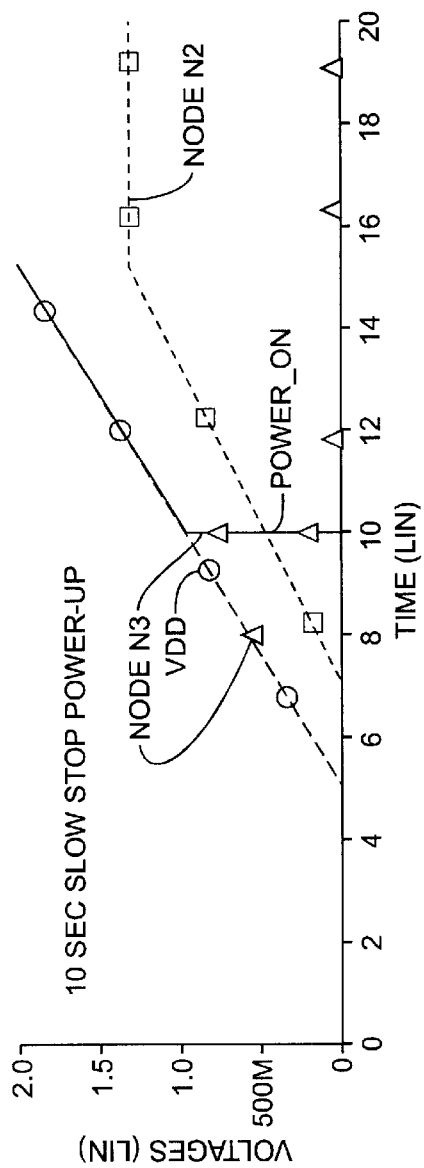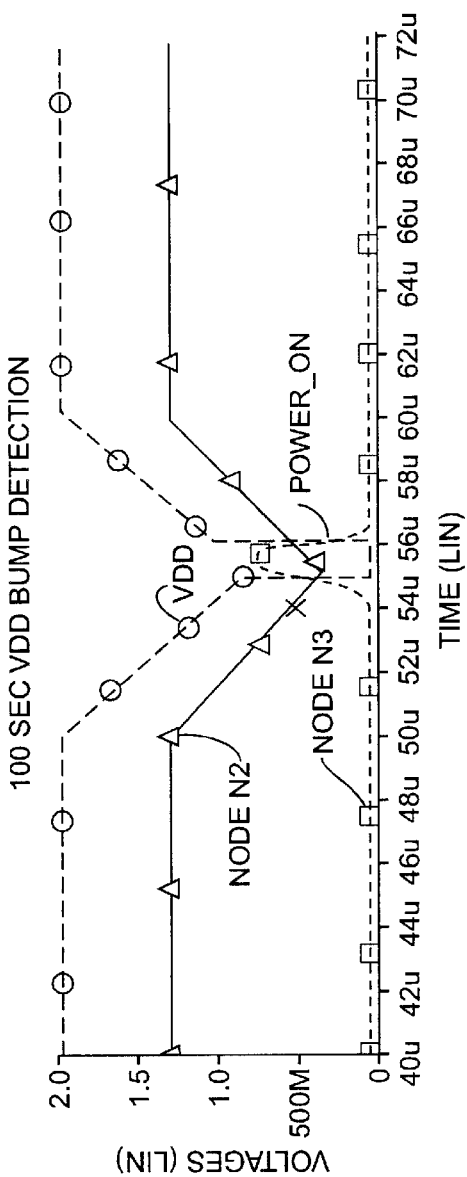

POWER-UP/POWER-DOWN DETECTION CIRCUIT

FIELD OF THE INVENTION

This invention relates to the field of power-up voltage detectors, and in particular to a power-up voltage detector which has improved linearity, sensitivity, and temperature characteristics.

BACKGROUND TO THE INVENTION

A power-up detector is used to detect the existence of a power supply voltage level which enables other circuits to operate correctly. A power-up detector typically generates a pulse that starts when the supply voltage is sufficient to supply the pulse, and ends when the supply voltage is sufficient to enable other circuits to operate correctly. The pulse is used to initialize the other circuits, and is thus typically required to be guaranteed to have a predetermined minimum duration. The circuits require the reset pulse as soon as possible during the power-up period firstly to minimize the time between the application of power and the functionality of the circuits, and secondly to avoid dangerous conditions in non-reset circuits during the power-up period.

One prior art approach for a power-up reset circuit described in U.S. Pat. No. 5,111,067 issued to Wong et al, uses two current mirrors and transistor threshold voltages to determine the reset trigger point. The current mirrors allow for very early power supply voltage detection, but using transistor threshold voltages which vary with process and temperature variations as well as with repetitive power-up/power-down cycles, will cause the reset pulse to be generated either too soon, too late or not at all, and thus the overall sensitivity of the power-up reset circuit is greatly decreased.

To address this shortfall, another prior art approach described in U.S. Pat. No. 5,654,656 issued to Geannopoulos, uses a number of transistors which are added as switches designed to reduce the biases which can lead to shifted threshold voltages caused by repetitive power-up/power-down transitions. The essential operation is still the same as in the preceding prior art embodiment of Wong et al, however, and still requires the PMOS feedback transistor as a threshold detector. Typically, PMOS transistors have a higher threshold voltage $V_{TP}$ than NMOS transistor threshold voltages, and the saturation current in a PMOS transistor is three times as large as the saturation current in an NMOS transistor of the same size. Furthermore, the circuit has a non-linear operating current-voltage characteristic which makes it highly susceptible to temperature and process variations.

Another concern in addition to power-up detection is power supply voltage bump detection. This type of circuit detects when the power supply falls below an acceptable operating range. A reset pulse to circuitry utilizing the power supply must be provided to only enable the circuits once the power supply has once again reached the operating range. A circuit which could also be used as a power-up detector, in addition to the voltage bump detection for which it is designed, is described in U.S. Pat. No. 5,686,848 issued to Mes et al. The circuit provides a reset pulse during a short interval when the power supply voltage is below a nominal operating range. The circuit described therein uses the power supply voltage and a reduced version thereof, to control the operation of a PMOS and an NOMS transistor respectively, connected in series between a charge storing node and ground. As the power supply voltage level decreases due to the action of a voltage bump, the PMOS transistor conducts more than the NMOS and enables current conduction in a reset pulse generating circuit. As the power supply voltage level subsequently increases due once again to the action of the voltage bump, the NMOS transistor conducts more than the PMOS transistor and as a result, the current conduction in the reset pulse generating circuit is ceased. The result is the generation of a reset pulse, the trailing edge of which can be used to reset a circuit that depends on the power supply voltage being above a particular value. This power-up/power-down reset circuit can also be used for power-up detection but cannot detect the power-up condition until the power supply has reached approximately $3V_{TN}$. However, waiting to issue the power-up reset pulse until this level is reached can be dangerous to internal circuits, as previously described.

A need therefore arises for a simple and versatile power-up detection circuit which has improved linear performance and has compensation for temperature and process variations.

SUMMARY OF THE INVENTION

The present invention provides a power-on detection circuit which is highly linear, can detect very low voltage, such as 500 mV, and compensates for temperature and process variations.

In accordance with an embodiment of the invention, a current mirror is used, which provides very low voltage detection. In addition one of the FETs of the current mirror constitutes one of the FETs of a CMOS inverter which provides a current conduction path for a reset circuit.

In accordance with another embodiment, a power-up detector for detecting power-up and power supply voltage bump conditions is comprised of a current mirror connected to a power supply, a pair of series connected resistors connected between the current mirror and ground, and providing a bias point at a junction of the series connected resistors, and a field effect transistor having a source-drain circuit connected between the current mirror and ground for providing an output signal, the transistor being controlled by the bias point.

In accordance with another embodiment, a power-up detector is comprised of a first PMOS FET having its source connected to a positive power supply, a pair of resistors connected in series between the drain of the FET and ground, a second PMOS FET having its source-drain circuit connected in series with an NMOS FET between the positive voltage power supply and ground, the gates of the first and second PMOS FETs being connected together, the gate of the NMOS FET being connected to a junction between the resistors, and an output node at the junction of the second PMOS FET and the NMOS FET.

In accordance with another embodiment, a power-up detector is comprised of an FET current mirror comprised of a pair of similar polarity FETS connected to a voltage rail, and being further comprised of a pair of series connected resistors connected to ground, one of the FETs forming one FET of a CMOS inverter, a gate of another of the FETs of the CMOS inverter being connected to a junction between the resistors, the junction between the first and another FETs of the CMOS inverter providing an output signal.

In accordance with another embodiment, a power-up detector comprises a first PMOS FET having its source connected to a positive voltage rail, a pair of resistors connected in series between its drain and ground, a CMOS inverter comprising a second PMOS FET having its source-drain circuit connected in series with an NMOS FET between the positive voltage rail and ground, the gates of the PMOS FETs being connected together, the gate of the NMOS FET being connected to a junction between the resistors, an output node at the junction of the second PMOS FET and the NMOS FET, and means for fixing the voltage at the junction of the gates of the PMOS FETs.

In accordance with another embodiment, a power-up detector comprises a first NMOS FET having its source connected to a ground voltage rail, a pair of resistors connected in series between its drain and a positive voltage rail, an CMOS inverter comprising a second NMOS FET having its source-drain circuit connected in series with a PMOS FET between the ground voltage rail and the positive voltage rail, the gates of the NMOS FETs being connected together, the gate of the PMOS FET being connected to a junction between the resistors, an output node at the junction of the second NMOS FET and the PMOS FET, and means for fixing the voltage at the junction of the gates of the NMOS FETs.

BRIEF DESCRIPTION OF THE DRAWINGS

A better understanding of the invention will be obtained by a consideration of the detailed description below, in conjunction with the following drawings, in which:

FIG. 2A is a graph of voltages at various nodes in the circuit of FIG. 1A for the power-up situation, FIG. 2B is a graph of voltages at various nodes in the circuit of FIG. 1A for the power supply voltage pump situation.

DETAILED DESCRIPTION OF EMBODIMENTS OF THE INVENTION

Figure 1A:
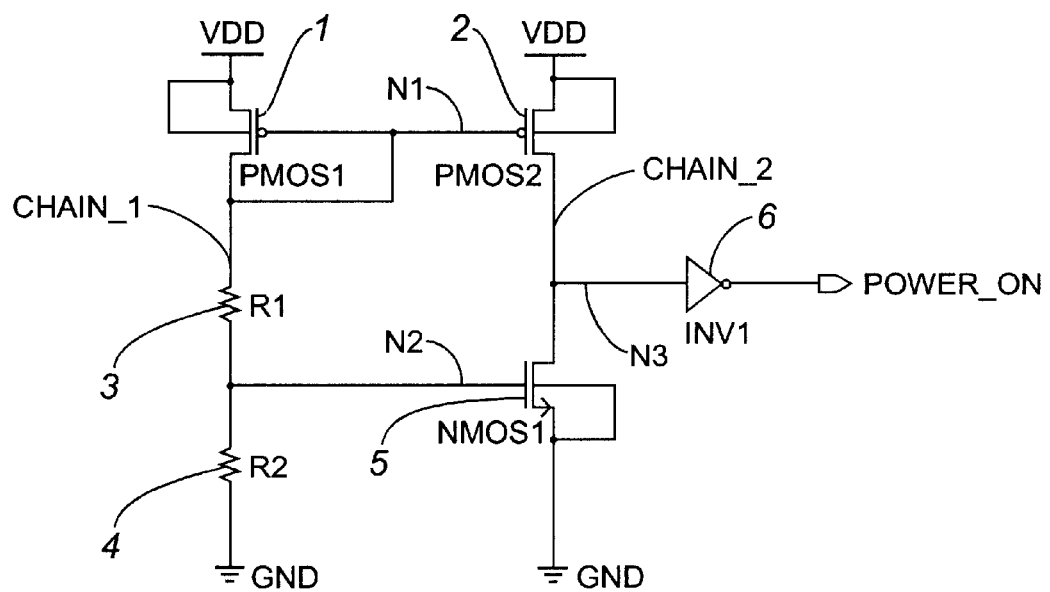
FIG. 1A is a schematic diagram of a preferred embodiment of the invention.

Turning to FIG. 1A, a current mirror is comprised of a P-channel (PMOS) FET 1, having its gate connected to its drain, to form a diode. The source of FET 1 is connected to a power supply rail VDD, the presence of which voltage above a predetermined threshold (e.g. 500 mV) is to be detected.

The current mirror is also comprised of PMOS FET 2, the gate of which is connected to the gate of FET 1, and the source of which is also connected to VDD.

A pair of series connected resistors 3 and 4 is connected between the drain of FET 1 and ground. An N-channel (NMOS) FET 5 has its drain connected to the drain of FET 2, and its source to ground. The gate of FET 5 is connected to the junction between resistors 3 and 4.

It is preferred that the junction between drains of FETs 2 and 5 be connected to the input of an output inverter 6, from which a POWER_ON signal can be obtained.

Figure 1B:
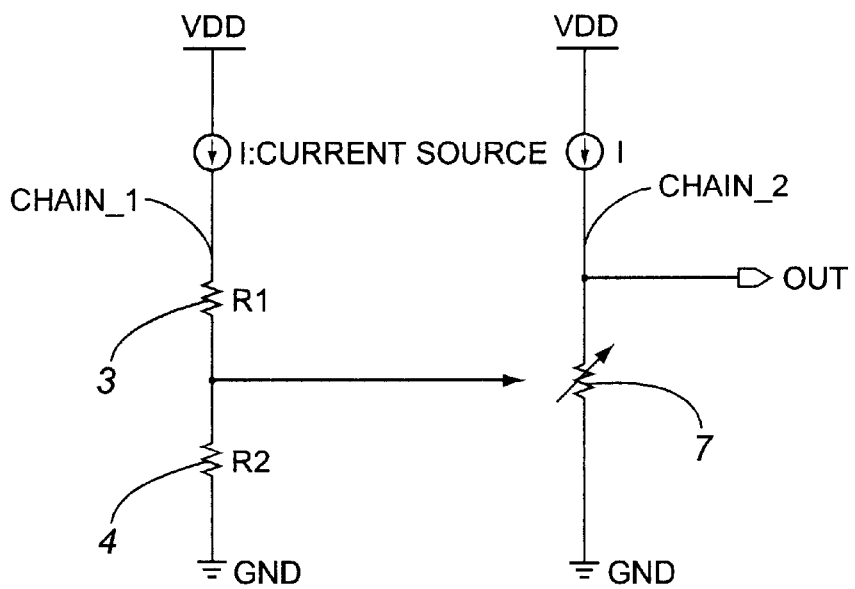
FIG. 1B is a schematic diagram of an equivalent circuit of the embodiment of FIG. 1A.
Figure 1C:
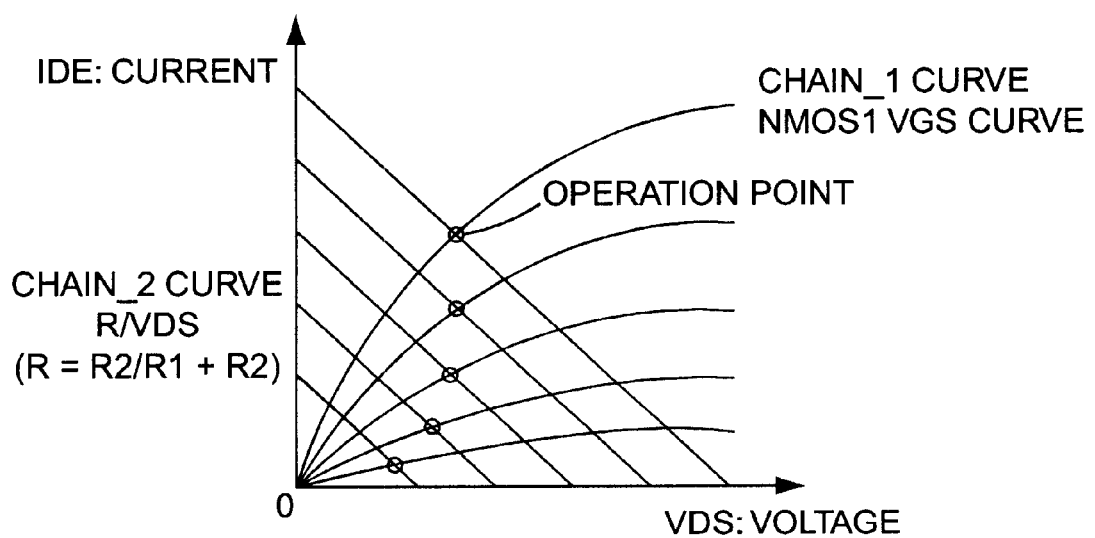
FIG. 1C is a graph of the current vs voltage characteristics of a pair of conduction paths of the circuit of FIG. 1A at a particular operating voltage.

An understanding of the invention will be obtained by reference to FIG. 1B, which is an equivalent circuit to the circuit of FIG. 1A, and to the current Vs voltage curves of the graph of FIG. 1C.

The current mirror of FIG. 1A can be said to be the equivalent of the two current sources $I_{bias}$ and $I_o$, in FIG. 1B. The resistors 3 and 4 are connected to one of the current sources $I_{bias}$, the voltage at the junction of the resistors forming a control voltage for FET 5, which is shown as equivalent variable resistor 7 in FIG. 1B. Variable resistor 7 is connected in series with the other current source $I_o$ between VDD and ground. The output of the equivalent circuit is at the junction of variable resistor 7 and the other current source I.

The circuit of resistor 3 and 4 and the associated current source will be referred to below as chain 1, and the circuit of variable resistor 7 and the associated current source will be referred to below as chain 2.

It will be seen that the bias current flowing in chain 1 will be $(V_{DD}-V_{TP})/(R1+R2)$, which is exactly linear as shown by the linear curve in FIG. 1C.

The current flowing in chain 2, on the other hand, is equal to $(K*(W/L)*(Vgs-Vt)^2)/2$, where W/L is the width W divided by the length L of FET 5,
Vgs is the gate to source voltage,
Vt is the threshold voltage of FET 5, $$K=(Esi*Eo*U)/D$$

Where Esi is the dielectric constant of silicon, typically taken as 12,
Eo is the permittivity of a vacuum (Eo=8.854*E-12) F/m, and
U is the bulk mobility of the silicon in FET 5.

The current in chain 2 follows a non-linear curve, as may be seen in FIG. 1C.

It may be seen that since the circuit forms a current mirror, the current in chain 2 tends to mirror the current in chain 1. One of the circuits operating points, i.e. where the curves intersect, is shown in FIG. 1C.

The junction of the gates of FETs 1 and 2 is marked in FIG. 1A as node N1, the junction of the gate of FET 5 with the junction of resistors 3 and 4 is marked as node N2, and the output junction of FETs 2 and 5 of the inverter is marked as node N3.

In operation, the power-up detector is intended to detect when the power supply voltage $V_{DD}$ reaches approximately 500 mV. For voltages at node N2 lower than $V_{TN}$, the threshold voltage of NMOS FET 5, FET 5 conducts no current and the voltage at node N3 tracks $V_{DD}$ exactly. As $V_{DD}$ begins to increase, due to the voltage divider action of resistors 3 and 4, the voltage on node N2 increases until it eventually reaches $V_{TN}$, and FET 5 begins to conduct. Due to the current mirror action of FETs 1 and 2, the current through FET 2 attempts to mirror the current through chain 1 increasing until it is approximately equal to the current in chain 1, i.e., $I_{bias}$ of chain 1, $I_o$ of chain 2. At this point, FET 2 moves into the resistive or triode region of operation from the saturation region it operated in until FET 5 was enabled. At this point, FET 5 is also operating in its resistive or triode region. As the voltage on node N2 is increased further, due to the high incremental gain achieved by FET 5 in the triode region of operation, FET 5 turns on fully and node N3 falls quickly towards ground. Once node N3 is brought to ground level, FET 5 enters its saturation region and as a result, any further increase in its gate voltage, i.e. node N2 will have little effect on node N3.

Since the circuit consists of a current mirror amplifier, the voltage detection sensitivity and the overall speed of the circuit are both very high.

Turning to FIG. 2A, a slow power-up condition as discussed above is illustrated with the corresponding node voltages from FIG. 1A. Note that as $V_{DD}$ begins to rise, due to the current mirror action, for the first 10 seconds, node n3 has the same value as $V_{DD}$, i.e. is tracking $V_{DD}$ exactly, while node n2, which is a reduced version of $V_{DD}$, also tracks the steady increase in $V_{DD}$. However, once node n2 reaches approximately 500 mV, FET 5 is switched on and node 3 quickly declines towards 0V while $V_{DD}$ continues to climb. Similarly, node n2 continues to track with $V_{DD}$ linearly until both reach their respective steady state levels. The 500 mV resolution for the power-up detector was not accomplished in the prior art. Instead, $V_{DD}$ had to attain a level of approximately $3V_{TN}$ before the detector of one prior art embodiment was activated.

The power-up detector of the present invention can also be used for power supply voltage bump detection, as illustrated in FIG. 2B. In this figure $V_{DD}$ is quickly decreased and increased back again over a period of 10 usec. Note that once again, the trigger point for node n3 is approximately 500 mV. The overall time for the output POWER_ON signal to reset is shown as 10 usec. The speed of the overall circuit is shown clearly in the short duration of the pulse on node n3. This speed is accomplished through the current mirror action coupled with the linear operation of chain 1.

The detector circuit has two ways to compensate for temperature and process variations. The first way is accomplished when chain 2 (formed of FETs 2 and 5), is in saturation and thereby compensates for variation in the resistance of resistors 3 and 4. As the temperature increases, the current through chain 2 decreases to compensate for decreased resistance in resistors 3 and 4.

The second compensation is achieved due to the fact that the current at node N1 has a negative feedback effect, since when the temperature is increased, the gate to source voltage of FETs 1 and 2 is decreased. Variation in the resistance of resistors 3 and 4 due to process variations is thereby compensated.

In addition, the width to length ratio of FETs 1 and 2 can be adjusted for temperature compensation.

Figure 3:
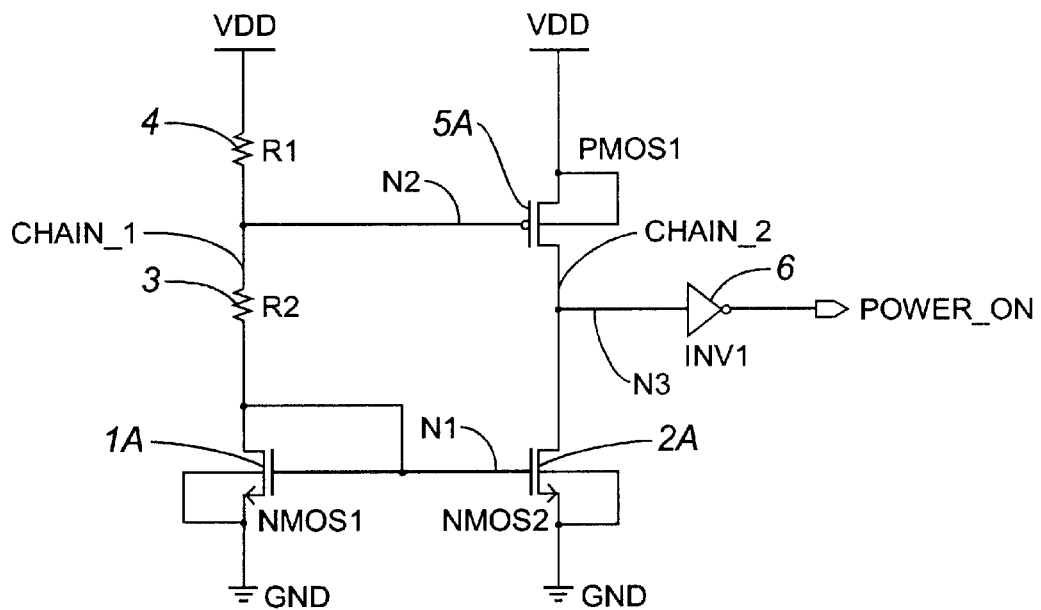
FIGS. 3, 4 and 5 are schematic diagrams of other embodiments of the invention.

While FIG. 1A has illustrated a circuit using a current mirror formed of a pair of PMOS FETs and an auxiliary NMOS FET in the inverter, it should be recognized that it could equally be formed of a pair of NMOS FETs and an auxiliary PMOS FET in the inverter, as shown in FIG. 3. In this case, the sources of the NMOS FETs are connected to ground, and the PMOS FET and series of resistors connected to VDD, as shown in FIG. 3. In this Figure each of the FETs which correspond to those in FIG. 1A, but with alternate conductivity type, is labeled with the same reference number and an A suffix. Operation is similar to the circuit of FIG. 1A, but with opposite polarity current and voltage.

Figure 4:
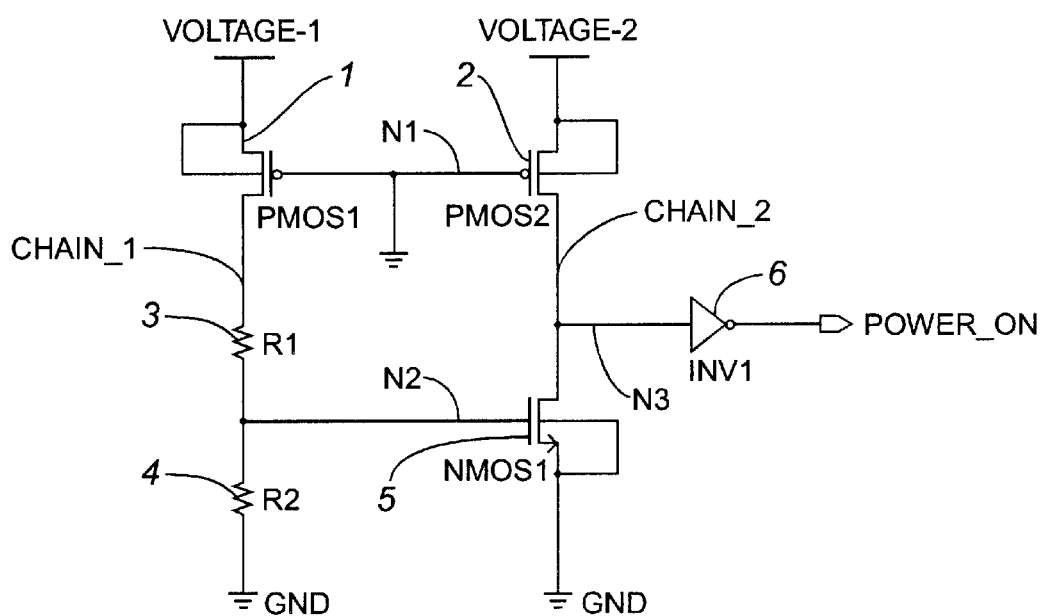

The circuit of FIG. 1A could alternatively be constructed with FET 1 connected as an FET rather than as a diode, as shown in FIG. 4, but with the junction of the gates of FETs 1 and 2 connected to ground.

Figure 5:
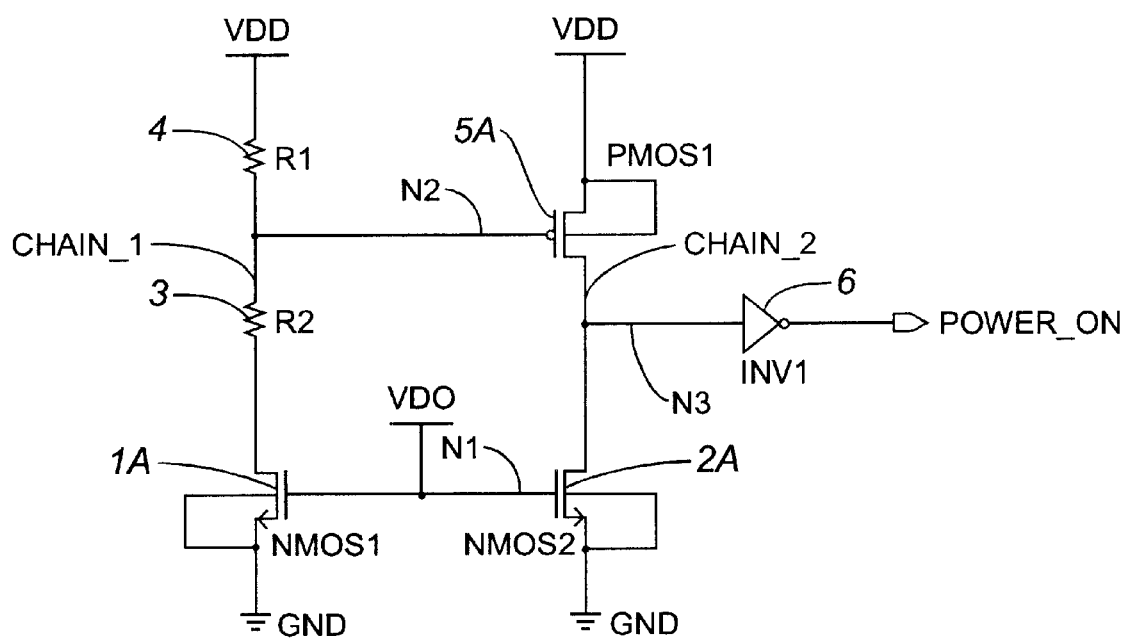

Similarly, the circuit of FIG. 3 could be alternatively be constructed with FET 1A connected as an FET rather than as a diode, as shown in FIG. 5, but with the junction of the gate of FETs 1A and 2A connected to VDD.

A person understanding this invention may now conceive of alternate embodiments and enhancements using the principles described herein. All such embodiments and enhancements are considered to be within the spirit and scope of this invention as defined in the claims appended hereto.

I claim:

1. A power-up detector comprising a first PMOS FET having its gate connected to ground, and its source connected to a positive power supply, a pair of series connected resistors connected directly between the drain of said first PMOS FET and ground, a second PMOS FET having its source-drain circuit connected in series with an NMOS FET between said voltage power supply and ground, the drain of the NMOS FET being connected to the drain of said second PMOS FET, the gate of the second PMOS FET being connected to ground, the gate of the NMOS FET being connected to the junction between said pair of resistors, an output node at the junction between the drain of the second PMOS FET and the drain of the NMOS FET, and an inverter connected to the junction between the drains of said second PMOS FET and said NMOS FET.

2. A power-up detector comprising a first NMOS FET having its gate connected to a positive power supply, and its source connected to a ground, a pair of series connected resistors connected directly between the drain of said first NMOS FET and said positive power supply, a second NMOS FET having its source-drain circuit connected in series with a PMOS FET between said voltage power supply and ground, the drain of the PMOS FET being connected to the drain of said second NMOS FET, the gates of the first and second NMOS FETs being connected together, the gate of the PMOS FET being connected to the junction between said pair of resistors, an output node at the junction between the drain of the second NMOS FET and the drain of the PMOS FET, and an inverter connected to the junction between the drains of said second NMOS FET and said PMOS FET.

\* \* \* \* \*